(12) United States Patent
Morin et al.

(10) Patent No.: US 7,745,039 B2
(45) Date of Patent: Jun. 29, 2010

(54) SYSTEM AND METHOD FOR CONTROLLING A RECHARGEABLE BATTERY

(75) Inventors: Christophe Morin, Rue des Chataigniers (FR); Serge Maloizel, Trois Palis (FR); Claude Chanson, Jarnac (FR)

(73) Assignee: SAFT, Bagnolet (FR)

( * ) Notice: Subject to any disclaimer, the term of this patent is extended or adjusted under 35 U.S.C. 154(b) by 886 days.

(21) Appl. No.: 11/463,345

(22) Filed: Aug. 9, 2006

(65) Prior Publication Data
US 2007/0082258 A1  Apr. 12, 2007

(30) Foreign Application Priority Data
Aug. 9, 2005  (FR)  .................... 05 08455

(51) Int. Cl.
*H01M 2/00* (2006.01)
*H02J 7/00* (2006.01)
(52) U.S. Cl. ................. 429/61; 320/134; 320/136
(58) Field of Classification Search ......... 429/61, 429/50; 320/134, 136
See application file for complete search history.

(56) References Cited
U.S. PATENT DOCUMENTS
6,208,117 B1   3/2001  Hibi
7,553,583 B2 *  6/2009  Eaves ............... 429/61

FOREIGN PATENT DOCUMENTS

| EP | 0 678 753 A1 | 10/1995 |
|---|---|---|
| EP | 0845383 A1 | 6/1998 |
| EP | 0 855 780 A1 | 7/1998 |
| EP | 1 018 652 A1 | 7/2000 |
| JP | 11-318033 | 11/1999 |
| WO | WO 2004/047215 A1 | 6/2004 |

OTHER PUBLICATIONS

European Search Report, Berlin, Nov. 14, 2006.

* cited by examiner

*Primary Examiner*—Patrick Ryan
*Assistant Examiner*—Thomas H. Parsons
(74) *Attorney, Agent, or Firm*—Sughrue Mion, PLLC

(57) ABSTRACT

A control system for a rechargeable battery including at least two electrochemical generators electrically connected by a power line. The system includes a protection unit and at least two control units respectively connected to the terminals of each electrochemical generator. Each control unit is designed to measure at least one operating parameter pertaining to the generator and to command the protection unit by transmission of carrier currents on the power line. The control system dispenses with the master processor for commanding the battery protection units and reduces the connecting wires by dispensing with the measurement leads designed to transmit the measurements of the operating parameters of each generator to the master processor.

17 Claims, 1 Drawing Sheet

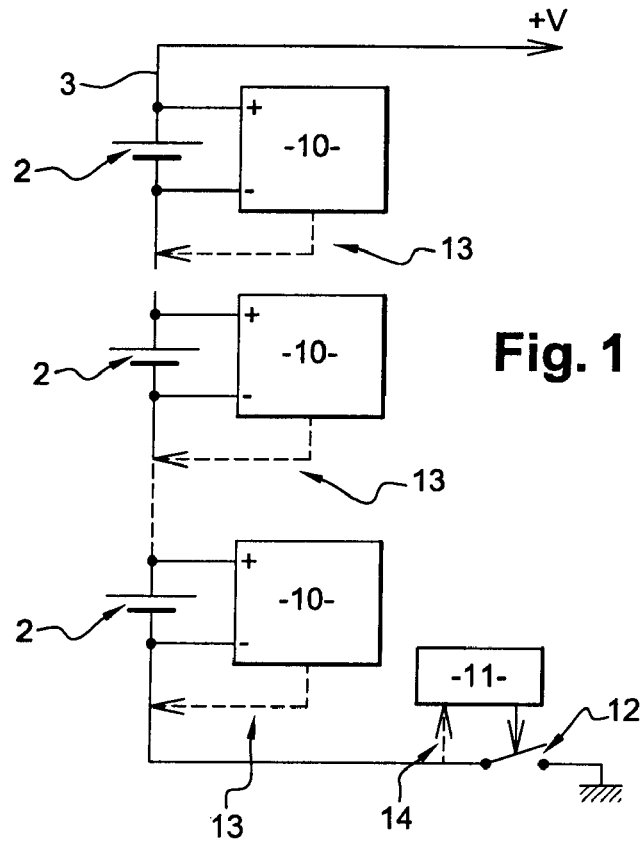
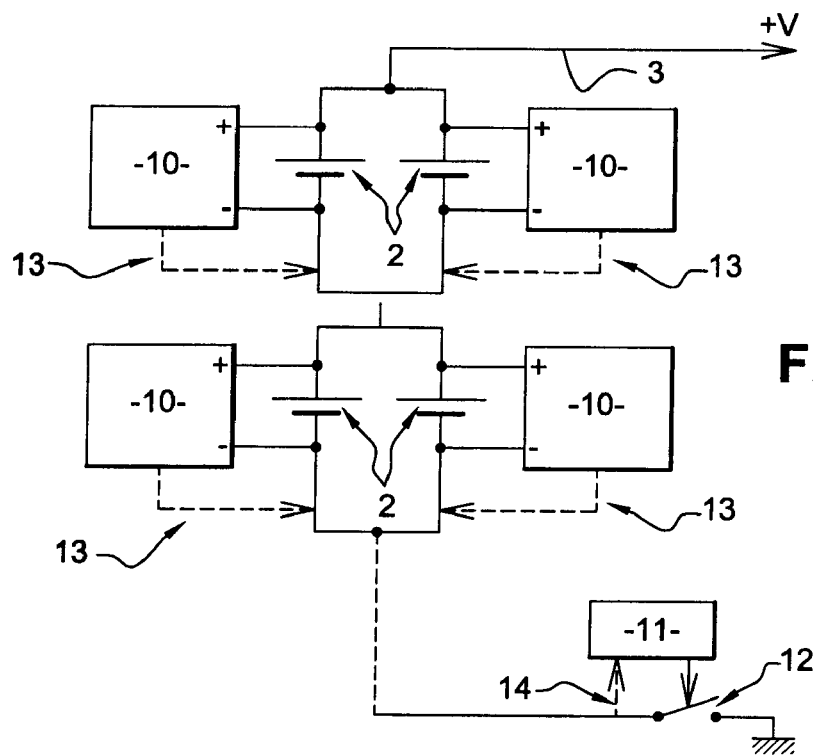

SYSTEM AND METHOD FOR CONTROLLING A RECHARGEABLE BATTERY

BACKGROUND OF THE INVENTION

The invention relates to the field of rechargeable batteries comprising a plurality of electrochemical generators connected to each other in series and/or in parallel by a power line. The invention relates more particularly to the field of battery operation control systems.

A control system can monitor the charge and discharge status of the battery, as well as the temperature and/or the current in each electrochemical generator. Each electrochemical generator constitutes an independent module that can be discharged so that the battery supplies the electrical power required by a given application, for example an electric vehicle. Moreover, the battery can be recharged to increase the stored capacity in each electrochemical generator. A power line connects the generators to each other and ends in terminals designed for connection to the application.

The voltage measured at the terminals of a battery can be representative of the charge status of the electrochemical generators (or accumulators) that constitute the battery modules. The charge status of the electrochemical generators is thus subject to permanent monitoring by voltage monitoring devices. More particularly, these devices are designed to prevent the electrochemical generators experiencing overcharging or severe discharging, which reduce battery performance and especially limit battery life.

Documents EP A0678753, EP A0855780 and EP A1018652 describe systems and methods for controlling a set of electrochemical generators comprising a common logic and a plurality of measurement interfaces associated with each generator. The common logic is integrated into a master processor of the battery receiving the measurements coming from each generator interface acting as slave parts. The master processor controls one or more protection units according to the measurements supplied by the slave interfaces. The master processor represents a significant part of the cost of the battery control system. In fact, this master processor is generally specific to each type of battery (number and type of generators, operating parameters dependant on the target application, etc.). Moreover, the control systems described in the above-mentioned documents require complex and costly wiring. In EP A 1018652, a measurement interface is individually associated with each generator and a common logic is provided for the control system as a whole. The individual measurement interfaces provide their measurement signals successively by means of a first wired serial connection. The measurement signals are transmitted in response to interface selection pulses transmitted in series from one interface to the other by a second serial wired link. The quantity of measuring wires is particularly important and increases the risk of system malfunction.

Document WO A 2004/047215 proposes dispensing with the wiring required for the transmission of the measurements between the slave interfaces associated with each generator and the master processor, by transmitting these measurements via a wireless link, in particular via a radio link. This document however does not propose dispensing with the master processor. Furthermore, a radio link can be unreliable and if interference breaks the radio link, the system can be delayed in detecting abnormal operating conditions.

Moreover, document JP 11318033 describes a centralised management system for a battery. This document also proposes dispensing with the connecting wires required for transmission of the measurements between the slave interfaces associated with each generator and the master processor, by transmitting these measurements by connecting onto the power line. This document, however, does not propose dispensing with the master processor.

A need therefore exists for a simpler and cheaper battery control system, and in particular for a control system that allows for the master processor to be dispensed with, while reducing the connecting wires for the transmission of the parameter measurements for each generator.

SUMMARY OF THE INVENTION

To this end, the invention proposes a control system for a rechargeable battery comprising at least two electrochemical generators electrically connected by a power line, the system comprising:
  a protection unit;
  at least two control units respectively connected to the terminals of each electrochemical generator, each control unit being designed to measure at least one operating parameter pertaining to the said generator and to command the protection unit by transmission of carrier currents on the power line.

According to one characteristic, the control system according to the invention does not comprise a master processor for all of the operating parameters measured at the terminals of each electrochemical generator.

According to the embodiments, the control system according to the invention can present one or more of the following characteristics:
  the operating parameter measured by each control unit is chosen from the voltage at the generator terminals and/or the temperature in the generator and/or the current passing through the generator;
  each control unit comprises an electronic element designed to compare the measured parameter with a predetermined threshold and designed to command the transmission of a signal to the protection unit when the said parameter exceeds the predetermined threshold;
  each control unit comprises a frequency oscillator and a current generator in order to produce high frequency current pulses transmitted on the power line;
  the protection unit commands a switch placed on the power line;
  the switch is designed to interrupt the charging and/or discharging of the battery;
  each control unit comprises a current sensor detecting a passage of current in the power line and a switch commanded by the said sensor; each unit being switched into standby mode when the current in the power line is below a predetermined value;
  in standby mode, the control unit interrupts the measurement of the operating parameter of the generator;
  each control unit is designed to detect the conditions in which the generator charging is complete, and to command diversion of the current locally.

The invention also relates to a rechargeable battery comprising at least two electrochemical generators electrically connected by a power line, characterised in that it comprises a control system according to the invention.

According to the embodiments of the battery according to the invention, each electrochemical generator is chosen from a group comprising at least lithium ion generators, silver zinc generators, polymer generators, alkaline accumulators (Ni-Cad, Ni-MH) and lead technology batteries.

The invention also proposes a method for controlling the voltage of a battery comprising at least two electrochemical generators electrically connected by a power line, the method comprising the following steps:

measurement of at least one operating parameter pertaining to each electrochemical generator, by a control unit connected to the terminals of the said generator;

detection of abnormal operating conditions by the said control unit;

transmission of a command signal to stop operation to a battery protection unit, comprising the steps of emission by the said control unit of carrier currents on the power line and reception of the said carrier currents by the protection unit;

interruption of the charging and/or discharging of the battery by the said protection unit.

According to the embodiments, the control method according to the invention also comprises one or more of the following characteristics:

interruption of the charging and/or discharging of the battery by the said protection unit.

the measurement step consists of measuring the voltage at the generator terminals and/or the temperature in the generator and/or the current passing through the generator;

the step of detection of abnormal operating conditions comprises a step of comparison of the operating parameter measured with a predetermined threshold;

the step of transmission of a command signal comprises the steps of emission by the said control unit of carrier currents on the power line and reception of the said carrier currents by the protection unit;

the step of emission of a command to stop operation consists of generating high frequency current pulses and sending these pulses on the power line;

According to one characteristic, the control method according to the invention also comprises the following steps:

measurement of the current passing through the power line by each control unit;

putting the control unit on standby when the current measured is below a predetermined value.

BRIEF DESCRIPTION OF THE DRAWINGS

Other characteristics and advantages of the invention will become apparent on reading the following detailed description of the embodiments of the invention, given as an example only and with reference to the diagrams, which show:

FIG. 1 gives a diagrammatic view of a battery control system according to a first embodiment of the invention;

FIG. 2 gives a diagrammatic view of a battery control system according to a second embodiment of the invention.

DETAILED DESCRIPTION OF THE INVENTION

The invention proposes a control system for a rechargeable battery. A battery of this type comprises a plurality of electrochemical generators electrically connected to each other by a power line. As explained above, the aim is to control the charge and discharge status of each generator. To this end, the control system according to the invention comprises a control unit connected to the terminals of each electrochemical generator and a battery protection unit. Each control unit is designed to measure at least one operating parameter pertaining to the generator to which it is connected, and to command the protection unit directly.

The master processor has thus been dispensed with, as each control unit associated with each generator, in addition to measuring a value of an operating parameter, generally the voltage at the generator terminals and/or the temperature, also directly commands the protection unit in the event that abnormal operating conditions are detected. The control units constitute a plurality of master components, while the centralised protection unit of the battery is enslaved. The system wiring is also simplified by dispensing with the measuring leads transmitting the measurements between the generator interfaces and a master processor, no longer present.

Furthermore, according to one variant of the invention, each control unit commands the protection unit by transmission of carrier currents on the power line. The system wiring is thus further simplified as the protection unit command signals are not transmitted via dedicated wired links but through the existing power line.

FIGS. 1 and 2 illustrate the system according to the invention. In FIG. 1, all of the electrochemical generators are connected in series by the power line, while in FIG. 2, the generators are placed in parallel two by two, and the pairs are connected in series by the power line.

The figures show a battery comprising a plurality of electrochemical generators 2, connected by a power line 3. The power line 3 extends between the negative and positive polarity terminals of the battery. The figures also show a plurality of control units 10, associated respectively with each generator 2. A control unit 10 is thus connected to the positive and negative terminals of each generator and locally captures the operating parameters pertaining to the generator with which it is associated. In particular, the control unit 10 can measure the voltage at the generator terminals 2 and/or the current passing through the generator and/or the temperature in the generator. To this end, the control unit 10 can have connection wires with sensors placed on or in the generator 2, in addition to the two strands for connection to the generator terminals.

Each control unit 10 is thus designed to measure a set of operating parameters of the generator with which it is associated. Furthermore, each control unit 10 is designed to interpret these measured parameters locally, in particular to detect abnormal operating conditions of the generator 2, such as overcharging or excessive discharging, a severe increase in temperature potentially resulting in irreversible damage to the generator. To this end, each control unit 10 can comprise an electronic element that compares the parameter measured with a predetermined threshold. If the said parameter exceeds the predetermined threshold, the control unit 10 detects a malfunction of the generator 2 and directly controls a battery protection unit 11.

In FIGS. 1 and 2, the battery protection unit 11 commands a switch 12 placed on the power line 3, the function of which is to stop or modify the charging and/or discharging of the battery. The protection unit 11 can be an intelligent switch, for example of the Smart MOS type, that can authorise the passage of the current in the power line 3 in one direction only in order to prevent either the charging or discharging of the battery, or that can prohibit any passage of current in the power line 3. The protection unit 11 can also incorporate self-protection functions in order to interrupt any passage of current in the power line in the event of a battery short-circuit or overcurrent. These self-protection functions are not linked to a processor but are determined by the choice and arrangement of the transistors used to manufacture the protection unit 11.

The protection unit 11 acts on the command of at least one of the control units 10; the protection unit 11 therefore constitutes a slave component, that is, without a processor or any function pertaining to the command of the operation of the battery. Conversely, each control unit 10 constitutes a master component, that is, equipped with means of command acting on the operation of the battery. The control units 10 do not however constitute a plurality of master processors as in the prior art. The control units 10 of the system according to the invention are units for the continuous measurement of the operating parameters of the generators, but these measurements do not have to be transmitted to a central processor to be interpreted, because interpretation of the measurements is performed locally in the control unit.

The master processor, which is costly and specific to each battery, is therefore dispensed with in favour of the plurality of control units 10. The electronic boards constituting the control units are not specific to a certain type of battery as they are designed to be associated with the generators; it is therefore not necessary to manufacture an electronic board for each battery type, but simply to duplicate the same board regardless of the number of generators in the battery. Costs are thus reduced by undifferentiated mass production of the control units.

Each control unit 10 is thus designed to measure the operating parameters (voltage, temperature, current or other) specific to a given generator 2 and to interpret these measurements in order to detect particular operating conditions. Thus the control unit 10 can detect conditions in which the generator charging is complete, and locally command a diversion of the current, in order to perform a function of equalisation with the other generators. The control unit can also detect abnormal operating conditions, such as an overcharge or an excessive discharge, and then command emission of a battery operation stop signal to the protection unit 11.

According to one advantageous embodiment, each control unit 10 commands the protection unit 11 by transmission of carrier currents on the power line 3. To this end, the control unit can comprise a frequency oscillator and a current generator in order to produce high frequency current pulses of approximately 10 MHz, for example. These pulses are coded, for example by associating digital values "0" or "1" with different current amplitude thresholds $A_0$ or $A_1$ for a given pulse. These high frequency current pulses are then transmitted on the power line 3 by an electrical coupling 13. The protection unit 11 comprises means of electrical coupling 14 with the power line 3 in order to receive these current pulses. For example, the means of electrical coupling 13 and 14 can comprise an electrical wire connected to the power line with a filter in order to allow only high frequency current pulses through.

The current pulses carrying information from a control unit 10 to the protection unit 11 do not disturb the flow of the charging or discharging current of the battery, which is located in a much lower frequency range—below 500 kHz. The use of the power line to send commands from the master control units to the slave protection unit enables the control system according to the invention to be further simplified by dispensing with the connection wires provided for measurements and commands.

Furthermore, according to one embodiment, each control unit 10 can comprise means of management of a standby mode. The electronic boards of the control units consume current taken from the battery, and thus subtract from the capacity of each generator. When the battery is stored or simply unused, it is not necessary to control the operation of each generator as abnormal conditions cannot arise. Each control unit 10 can therefore detect the passage of current on the power line 3 and if no current is circulating, conclude from this that measurement of the operating parameters of the generator 2 can be interrupted. To this end, the control unit 10 can comprise a current sensor placed on or close to the power line 3, such as for example a Hall effect sensor, a magneto resistor or a very low value resistor placed on the power line and performing a so-called "shunt" function.

Moreover, the control unit 10 comprises a standby switch connected to the current sensor; when the current circulating in the power line 3 falls below a predetermined value, the standby switch switches the control unit measurement circuits into a standby mode to interrupt the measurement of the operating parameters of the generator. The current sensor nevertheless remains active, and when the current circulating in the power line 3 exceeds a predetermined value, the standby switch switches the control unit measurement circuits to reactivate the taking of measurements of the operating parameters of the generator. The electricity consumption of the control units is thus optimised and the battery capacity retained for the application for which it is intended.

The invention thus enables the manufacturing cost of electrochemical generator batteries to be optimised by reducing the cost and complexity of the associated control system, in particular by dispensing with the master processor generally associated with each type of battery for interpreting all of the measurements of the operating parameters of each generator. This optimisation of the control system can be used on any type of battery, regardless of the electrochemical cell used in the generators. The invention therefore relates to all types of batteries whatever generators are used: lithium ion generators, silver zinc generators or polymer generators, alkaline accumulators (Ni-Cad, Ni-MH), lead technology batteries, etc. This allows for higher production volumes and economies of scale.

Of course, this invention is not limited to the embodiments described as an example; thus the transmission of a stop command signal from an control unit to the battery protection unit can be carried out otherwise than by transmission of carrier currents on the power line, for example by radio or wired link, although the use of carrier currents is preferred for the reasons of reliability and simplicity described above.

The invention claimed is:

1. Control system for a rechargeable battery comprising at least two electrochemical generators electrically connected by a power line, the system comprising:
   a protection unit;
   at least two control units, respectively connected to the terminals of each electrochemical generator, each control unit measuring at least one operating parameter pertaining to the said generator and commanding the protection unit by transmission of carrier currents on the power line.

2. System according to claim 1, wherein the operating parameter measured by each control unit is chosen from the voltage at the terminals of the generator and/or the temperature in the generator and/or the current passing through the generator.

3. System according to claim 1, wherein each control unit comprises an electronic element designed to compare the parameter measured with a predetermined threshold and designed to command the transmission of a signal to the protection unit when the said parameter exceeds the predetermined threshold.

4. System according to claim 1, wherein each control unit comprises a frequency oscillator and a current generator in such a way as to produce high frequency current pulses transmitted on the power line.

5. System according to claim 1, wherein the protection unit commands a switch placed on the power line.

6. System according to claim 5, wherein the switch is designed to interrupt the charging and/or discharging of the battery.

7. System according to claim 1, wherein each control unit comprises a current sensor detecting the passage of current in the power line and a switch commanded by the said sensor, each unit being switched into standby mode when the current in the power line is below a predetermined value.

8. System according to claim 7, wherein standby mode, the control unit interrupts the measurement of the operating parameter of the generator.

9. System according to claim 1, wherein each control unit is designed to detect conditions in which the generator charging is complete, and to command diversion of the current locally.

10. System according to claim 1, wherein it does not comprise a master processor for all of the operating parameters measured at the terminals of each electrochemical generator.

11. Rechargeable battery comprising at least two electrochemical generators electrically connected by a power line, wherein it comprises a control system comprising:
- a protection unit;
- at least two control units, respectively connected to the terminals of each electrochemical generator, each control unit being designed to measure at least one operating parameter pertaining to the said generator and to command the protection unit by transmission of carrier currents on the power line.

12. Battery according to claim 11, wherein each electrochemical generator is chosen from a group comprising at least lithium ion generators, silver zinc generators, polymer generators, alkaline accumulators (Ni Cad, Ni-MH) and lead technology batteries.

13. Method for the control of the voltage of a battery comprising at least two electrochemical generators electrically connected by a power line, the method comprising the following steps:
- measurement of at least one operating parameter pertaining to each electrochemical generator, by a control unit connected to the terminals of the said generator;
- detection of abnormal operating conditions by the said control unit;
- transmission of a command signal to stop operation to a battery protection unit, comprising the steps of emission by the said control unit of carrier currents on the power line and reception of the said carrier currents by the protection unit;
- interruption of the charging and/or discharging of the battery by the said protection unit.

14. Method according to claim 13, wherein the measurement step consists of measuring the voltage at the terminals of the generator and/or the temperature in the generator and/or the current passing through the generator.

15. Method according to claim 13, wherein the step of detection of abnormal operating conditions comprises a step of comparison of the operating parameter measured with a predetermined threshold.

16. Method according to claim 15, wherein the step of emission of a command to stop operation consists of generating high frequency current pulses and sending these pulses on the power line.

17. Method according to claim 13, further comprising one of the following steps:
- measurement of the current passing through the power line by each control unit;
- placing the control unit in standby when the current measured is below a predetermined value.

* * * * *